United States Patent
Sakai et al.

(10) Patent No.: US 6,608,482 B2
(45) Date of Patent: Aug. 19, 2003

(54) BATTERY CONTROL METHOD FOR HYBRID VEHICLE

(75) Inventors: Shoji Sakai, Toyota (JP); Tetsuya Kobayashi, Anjo (JP)

(73) Assignees: Denso Corporation, Kariya (JP); Nippon Soken, Inc., Nishio (JP)

(*) Notice: Subject to any disclaimer, the term of this patent is extended or adjusted under 35 U.S.C. 154(b) by 4 days.

(21) Appl. No.: 10/073,026

(22) Filed: Feb. 12, 2002

(65) Prior Publication Data

US 2002/0113595 A1 Aug. 22, 2002

(30) Foreign Application Priority Data

Feb. 14, 2001 (JP) ............................... 2001-37348

(51) Int. Cl.[7] ............................................. G01N 27/416
(52) U.S. Cl. ....................................... 324/426; 320/132
(58) Field of Search ................................. 324/426, 427, 324/429, 430, 433; 320/132, 149, DIG. 21

(56) References Cited

U.S. PATENT DOCUMENTS

| 4,912,416 A | * | 3/1990 | Champlin |
| 5,572,136 A | * | 11/1996 | Champlin |
| 5,585,728 A | * | 12/1996 | Champlin |

FOREIGN PATENT DOCUMENTS

JP  A 2000-69606  3/2000

* cited by examiner

*Primary Examiner*—Edward H. Tso
(74) *Attorney, Agent, or Firm*—Oliff & Berridge, PLC

(57) ABSTRACT

A battery control system is provided which charges or discharges a storage battery installed in a hybrid vehicle to bring a state-of-charge of the storage battery into agreement with a target one. The system determines whether the state-of-charge lies within a given narrower range defined around the target state-of-charge and corrects the state-of-charge based on an open-circuit voltage of the battery when the state-of-charge lies within the given narrower range, thereby eliminating a cumulative error in calculating the state-of-charge of the battery caused by a variation in charge/discharge efficiency of the battery.

21 Claims, 5 Drawing Sheets

BATTERY CONTROL METHOD FOR HYBRID VEHICLE

BACKGROUND OF THE INVENTION

1. Technical Field of the Invention

The present invention relates generally to a battery control method for hybrid vehicles, and more particularly to a state-of-charge determining method of determining a state-of-charge of a storage battery installed in a hybrid vehicle accurately.

2. Background Art

In recent years, attention is paid to hybrid vehicles equipped with, as a power source, an internal combustion engine and an electric motor actuated by a storage battery for fuel economy. Typical batteries installed in the hybrid vehicles are discharged during a high-load operation such as acceleration and recharged during a low-load operation such as traveling at constant speed or deceleration. In order to carry out such discharging and recharging effectively, it is important to keep SOC (State Of Charge which is also referred to as an available reserve capacity or residual electric energy) at a middle value (e.g., 50% to 70% of a fully charged energy of a battery). It is, thus, essential to monitor the SOC of the storage battery.

As a method of measuring the SOC, there is known a technique for integrating or totalizing the amount of current discharged from a storage battery. This technique, however, encounters a drawback in that errors in totalizing the discharged current are accumulated due to a variation in charging/discharging efficiency, thus making it difficult to measure the amount of reserve current in the battery accurately. In order to avoid this problem, Japanese Patent First Publication No. 2000-69606 proposes a correction system designed to correct the charging/discharging efficiency as a function of a difference between an actual state of charge and an estimated state of charge of a storage battery. The actual state of charge is determined by an upper or a lower limit of a voltage-to-current characteristic stored in a memory of the system when it is reached. The estimated state of charge is determined by a totalized amount of current discharged from the battery. The system, however, has a problem in that it is difficult to eliminate the totalizing error completely because of a change in charging/discharging efficiency arising from the history of use of the battery.

SUMMARY OF THE INVENTION

It is therefore a principal object of the invention to avoid the disadvantages of the prior art.

It is another object of the invention to provide a battery control method for hybrid vehicles which is capable of controlling a state-of-charge of a storage battery to bring it into agreement with a target one accurately.

According to one aspect of the invention, there is provided a battery control method of charging or discharging a storage battery installed in a hybrid vehicle to bring a calculated state-of-charge of the storage battery into agreement with a target state-of-charge. The method comprises the steps of: (a) determining an open-circuit voltage of the storage battery installed in the hybrid vehicle using a voltage developed across the storage battery and a current flowing into or out of the storage battery in a given voltage-to-current relation of the storage battery; (b) totalizing an amount of current flowing into or out of the storage battery in a cycle to calculate a state-of-charge of the storage battery; (c) comparing the open-circuit voltage with a reference voltage which corresponds to a reference state-of-charge predetermined in a state-of-charge correction range defined around a target state-of-charge of the storage battery; and (d) correcting the state-of-charge of the storage battery when the state-of-charge lies within the state-of-charge correction range by brining the state-of-charge close to the reference state-of-charge based on a result of comparison between the open-circuit voltage and the reference voltage. This eliminates a cumulative error in calculating the state-of-charge of the battery caused by a variation in charge/discharge efficiency of the battery. The reference voltage may be set to an open-circuit voltage corresponding to a central value of the state-of-charge correction range. The state-of-charge correction is prohibited when the state-of-charge changes out of the state-of-charge correction range, thereby minimizing an error in correcting the state-of-charge arising from use of a value of the open-circuit voltage undergoing the effect of the charge-caused polarization greatly.

In the preferred mode of the invention, the step is further provided which prohibits the correction step when it is determined that a discharge-caused polarization of the storage battery becomes greater than a given value, that is when the batter is charged so that the state-of-charge increases out of the state-of-charge correction range, after which the battery is discharged so that the state-of-charge returns and falls within the state-of-charge correction range, thereby eliminating an error in correcting the state-of-charge arising from the discharge-caused polarization of the battery.

The correcting step increases the state-of-charge when the open-circuit voltage is greater than the reference voltage and decreases the state-of-charge when the open-circuit voltage is smaller than the reference voltage.

The method may further comprise the step of prohibiting the correction step for a preselected period of time when the storage battery has been discharged so that the state-of-charge decreases by a given amount out of the state-of-charge correction range.

The method may further comprise the step of determining whether the open-circuit voltage has exceeded a high open-circuit voltage higher than the reference voltage or not and the step of correcting the reference voltage by a preselected value when it is determined that the open-circuit voltage has exceeded the high open-circuit voltage.

In instead of the open-circuit voltage, a voltage developed across terminals of the storage battery when the storage battery is charged or discharged with a given current may be used.

The correction step changes the state-of-charge of the storage battery by a preselected correction value in a cycle when the state-of-charge lies within the state-of-charge correction range. The method further comprises the step of determining that the storage battery has undergone a drop in state-of-charge due to self discharge when a cumulative value of the correction value exceeds a given value, and the open-circuit voltage remains below a given voltage lower than the reference voltage.

According to the second aspect of the invention, there is provided a battery control method of charging or discharging a storage battery installed in a hybrid vehicle to bring a calculated state-of-charge of the storage battery into agreement with a target state-of-charge. The method comprises the steps of: (a) determining an open-circuit voltage of the storage battery installed in the hybrid vehicle using a voltage developed across the storage battery and a current flowing into or out of the storage battery in a given voltage-to-current relation of the storage battery; (b) totalizing an amount of current flowing into or out of the storage battery in a cycle to calculate a state-of-charge of the storage battery; (c) determining whether the storage battery has been charged so that the state-of-charge of the storage battery increases out of a preselected state-of-charge range defined around the target state-of-charge or not; (d) determining whether the open-circuit voltage has reached a high open-circuit voltage higher than a reference voltage which corresponds to a reference state-of-charge predetermined in the state-of-charge range or not; and (e) discharging the storage battery until the state-of-charge reaches a given value smaller than the preselected state-of-charge range by a given amount when it is determined that the open-circuit voltage has reached the high open-circuit voltage.

In the preferred mode of the invention, the method further comprises the step of prohibiting the storage battery from being charged when it is determined that the open-circuit voltage has reached the high open-circuit voltage.

The method further comprises the step of, when the storage battery has been charged so that the state-of-charge is greater than a high state-of-charge higher than the preselected state-of-charge range, determining a maximum value of the state-of-charge calculated in a cycle and the step of discharging the storage battery by a given amount determined as a function of the maximum value of the state-of-charge after the storage battery is discharged, and the state-of-charge falls within the preselected state-of-charge range.

The maximum value may be reset each time the storage battery is discharged by the given amount.

The method further comprises the step of charging the storage battery until the open-circuit voltage reaches the high open-circuit voltage when the open-circuit voltage remains below the high open-circuit voltage for a given period of time.

Instead of the open-circuit voltage, a voltage developed across terminals of the storage battery when the storage battery is charged or discharged with a given current may be used.

According to the third aspect of the invention, there is provided a battery control method of charging or discharging a storage battery installed in a hybrid vehicle to bring a calculated state-of-charge of the storage battery into agreement with a target state-of-charge. The method comprises the steps of: (a) totalizing an amount of current flowing into or out of the storage battery in a cycle to calculate a state-of-charge of the storage battery; (b) determining whether the storage battery has been discharged until the state-of-charge of the storage battery decreases by a given amount out of a preselected state-of-charge range defined around the target state-of-charge or not; and (c) charging the storage battery until the state-of-charge reaches a given value higher than the preselected state-of-charge range by a predetermined amount when it is determined that the storage battery has been discharged until the state-of-charge of the storage battery decreases by the given amount.

The method further comprises the step of prohibiting the storage battery from being discharged further when it is determined that the storage battery has been discharged until the state-of-charge of the storage battery decreases by the given amount.

The method further comprises the steps of: determining an open-circuit voltage of the storage battery using a voltage developed across the storage battery and a current flowing into or out of the storage battery in a given voltage-to-current relation of the storage battery; comparing the open-circuit voltage with a reference voltage which corresponds to a reference state-of-charge predetermined in the preselected state-of-charge range; correcting the state-of-charge of the storage battery only when the state-of-charge lies within the preselected state-of-charge range by brining the state-of-charge close to the reference state-of-charge based on a result of comparison between the open-circuit voltage and the reference voltage; and prohibiting the correction step for a preselected period of time when the storage battery has been discharged so that the state-of-charge decreases by a given amount out of the preselected. state-of-charge range.

Instead of the open-circuit voltage, a voltage developed across terminals of the storage battery when the storage battery is charged or discharged with a given current may be used According to the fourth aspect of the invention, there is provided a battery control method of charging or discharging a storage battery installed in a hybrid vehicle to bring a calculated state-of-charge of the storage battery into agreement with a target state-of-charge. The method comprises the steps of: (a) determining an open-circuit voltage of the storage battery installed in the hybrid vehicle using a voltage developed across the storage battery and a current flowing into or out of the storage battery in a given voltage-to-current relation of the storage battery; (b) totalizing an amount of current flowing into or out of the storage battery in a cycle to calculate a state-of-charge of the storage battery; (c) determining whether the storage battery has been charged so that the state-of-charge of the storage battery increases out of a preselected state-of-charge range defined around the target state-of-charge or not; (d) determining whether the open-circuit voltage has exceeded a high open-circuit voltage higher than a reference voltage which corresponds to a reference state-of-charge predetermined in the preselected state-of-charge range or not; and (e) correcting the reference voltage by a preselected value when it is determined that the open-circuit voltage has exceeded the high open-circuit voltage.

In the preferred mode of the invention, the method further comprises the step of determining whether the state-of-charge has exceeded a high state-of-charge higher than the preselected state-of-charge range or not. The correction step corrects the reference voltage when it is determined that the state-of-charge has exceeded the high state-of-charge.

The method further comprises the step of charging the storage battery until the open-circuit voltage reaches the high open-circuit voltage when the open-circuit voltage remains below the high open-circuit voltage for a given period of time.

Instead of the open-circuit voltage, a voltage developed across terminals of the storage battery when the storage battery is charged or discharged with a given current may be used.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 2:
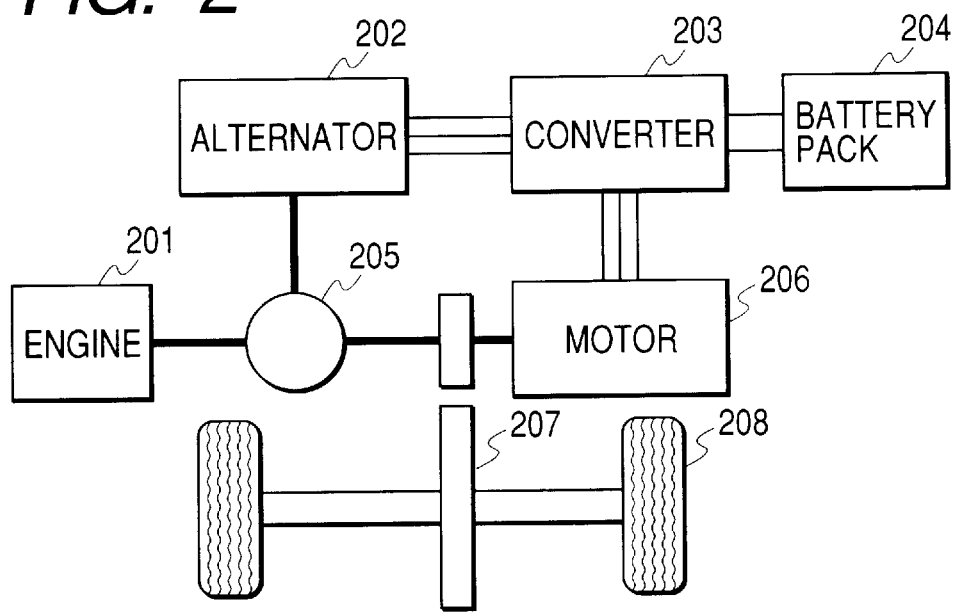
FIG. 2 is a block diagram which shows a battery state-of-charge control system according to the invention.

Referring to the drawings, wherein like reference numbers refer to like parts in several views, particularly to FIG. 2, there is shown a parallel hybrid vehicle equipped with a battery state-of-charge control system according to the first embodiment of the invention. The parallel hybrid vehicle is equipped with an electric motor 206 used in assisting the output of an internal combustion engine 201 to reduce a variation in output of the engine for reducing exhaust emissions and fuel economy of the engine.

The parallel hybrid vehicle also includes a three-phase alternator 202, a converter 203, and a rechargeable battery pack 204. The three-phase alternator 202 is activated by the part of output of the engine 201 to produce alternating current. The converter 203 works to change the alternating current from the alternator 202 to direct current and supply it to the battery pack 204 and also change direct current from the battery pack 204 to alternating current and supply it to the three-phase electric motor 206.

The output of the engine 201 is transmitted to wheels 208 through a torque transfer 205 and a gear 207. The motor 206 establishes transmission of power between itself and the engine 201 and the wheels 208 through a shaft.

Figure 3:
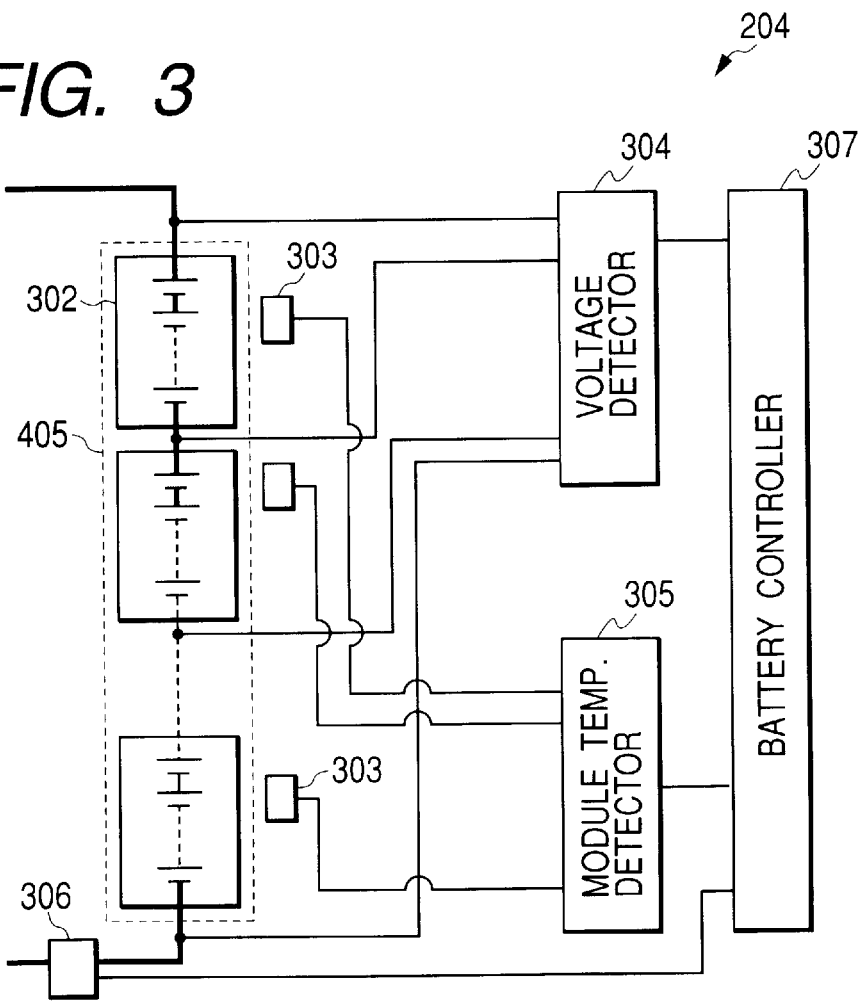
FIG. 3 is a partially enlarged view which shows an internal structure of a battery pack installed in a hybrid vehicle as illustrated in FIG. 2.

The battery pack 204, as clearly shown in FIG. 3, consists of a battery unit 405, temperature sensors 303, a voltage detector 304, a module temperature detector 305, a current detector 306, and a battery controller 307. The battery unit 405 is made up of a plurality of battery modules 302 connected in series. Each of the battery modules 302 consists of storage cells connected in series. The temperature sensors 303 are provided one for each of the battery modules 302 to produce a voltage signal as a function of the temperature of the battery module 302. The voltage detector 304 is made of a multiplexer which works to measure the voltage of each of the battery modules 302. The module temperature detector 305 is made of a multiplexer which works to receive the voltage signal from each of the temperature sensors 302 to determine the temperature of a corresponding one of the battery modules 302. The current detector 306 measures the current discharged from the battery unit 405. The battery controller 307 is made of a microcomputer which works to receive outputs from the voltage detector 304, the module temperature detector 305, and the current detector 306 and calculates the capacity of each of the battery modules 302.

The battery controller 307 determines the state of charge (SOC) of the battery unit 405 and provides a signal indicative thereof to an external control device (not shown). The voltage detector 304 and the modulate temperature detector 305 may alternatively be provided for each of the cells of the battery modules 302 for compensating for variations in temperature and voltage of the cells. In this embodiment, the single voltage detector 304 and the single modulate temperature detector 305 are provided for keeping the manufacturing costs down.

Figure 4:
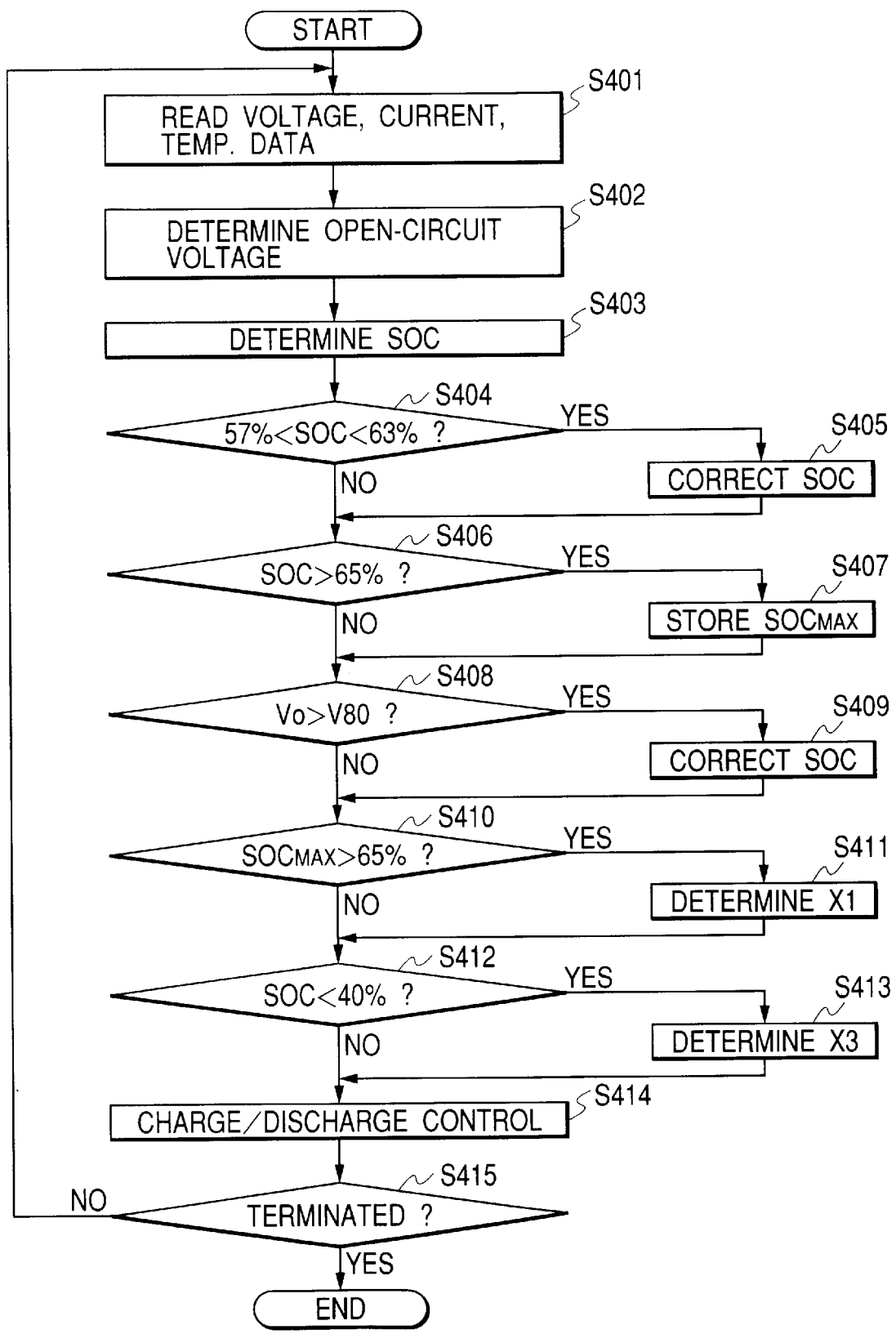
FIG. 4 is a flowchart of a program to control a state-of-charge of a storage battery according to the first embodiment of the invention.

FIG. 4 is a flowchart of a program or logical steps to be executed by the battery controller 307 to determine the state of charge (SOC) of the battery unit 405 accurately. This program is executed cyclically at an interval of, for example, 1 sec.

The battery controller 307 of this embodiment works to selectively discharge or charge the battery unit 405 through the converter 203 to bring the SOC of the battery unit 405 into agreement with a target value that is, for example, 60% of a full state of charge of the battery unit 405.

Upon turning on of an ignition switch (not shown) of the vehicle, the routine proceeds to step 401 wherein the battery controller 307 reads therein data on the voltage of each of the battery modules 302 (will also be referred to as module voltage VB below), the current flowing into or out of the battery unit 405 (will also be referred to as charging/discharging current IB below), and the temperature of each of the battery modules 302 (will also be referred to as battery temperature TB below).

The routine proceeds to step 402 wherein an open-circuit voltage Vo per cell in each of the batter modules 302 is calculated according to Eq. (1) below using the data derived in step 401 and an internal resistance Rk of one of the cells determined in step 405, as will be described later in detail. If this program operation is a first control activation, a preselected initial value of the internal resistance Rk may be used.

$$Vo = VB/n - Rk \times IB \qquad (1)$$

where n denotes the number of the cells of each of the battery modules 302.

Each of the open-circuit voltages Vo is corrected as a function of the battery temperature TB of a corresponding one of the battery modules 302 by look-up using, for example, a map listing a preselected relation between the battery temperature TB and the open-circuit voltage Vo. Such correction may alternatively be made by a mathematical operation.

The sum of all the open-circuit voltages Vo is divided by the number of the battery modules 302 to define an average value thereof as an open-circuit voltage Vo for use in the following operation.

The routine proceeds to step 403 wherein the charging/discharging current TB is integrated to determine the SOC according to Eq. (2) below.

$$SOC = (((SOC_{-1} \cdot \text{rated capacity}/100) - IB \cdot dt) / \text{rated capacity}) \times 100\% \qquad (2)$$

where $SOC_{-1}$ indicates the value of SOC derived one program execution cycle earlier, dt is an interval between a time when the data was read in step 401 one program cycle earlier and a time when the data was read in step 401 in the current program execution cycle (i.e., the program execution cycle of 1 sec.). Note that the charging/discharging current IB is expressed in a minus value when it indicates the current flowing into the battery unit 405 and in a plus value when it indicates the current flowing out of the battery unit 405, and an initial SOC is given by the SOC stored upon termination of previous running of the vehicle.

The routine proceeds to step 404 wherein it is determined whether the SOC lies within a given range of 57% and 63% (57%<SOC<63%) or not. If a YES answer is obtained, then the routine proceeds to step 405. Alternatively, if a NO answer is obtained, then the routine proceeds to step 406.

In step 405, the internal resistance Rk' of each of the battery modules 302 is determined through, for example, the least squares method base on a pair of the module voltage VB thereof and the charging/discharging current IB derived in step 401 and such pairs derived for a given number of previous program cycles. For example, after a given number of pairs of the module voltage VB and the charging/discharging current IB for a preselected period of time have been obtained, and a maximum-to-minimum current difference has reached a preselected value, the internal resistance Rk' is calculated using the least squares method. Each of the internal resistances Rk' is divided by the number of cells n of a corresponding one of the battery modules 302 to determine the internal resistance Rk of one of the cells. An initial value of the internal resistance Rk may alternatively be determined in advance. Subsequently, the SOC derived in step 403 is corrected in a manner, as discussed below, based on a difference between the open-circuit voltage Vo derived in step 402 and a reference voltage V60 that corresponds to a given reference SOC (e.g., an open-circuit voltage when an actual SOC of the battery unit 405 is 60%) within the range of 57% to 63% predetermined in view of the so-called charge-caused polarization in which the open-circuit voltage Vo drops due to continuation of charge. If V60<Vo, the battery controller 307 concludes that the SOC derived in step 403 is smaller than an actual SOC of the battery unit 405 and increments the SOC derived in step 403 by a given value (e.g., (IB/3600/rated capacity)×100). Alternatively, if V60>Vo, the battery controller 307 concludes that the SOC derived in step 403 is greater than the actual SOC and decrements the SOC by the given value.

The correction in step 405 is made sequentially as long as the SOC lies within the range of 57% and 63% until the open-circuit voltage Vo is identical with the reference voltage V60, thereby minimizing an error in integrating the charging/discharging current TB arising from an error of an output of the current detector 204 and/or a variation in efficiency at which the battery unit 405 is charged or discharged. Specifically, the battery controller 307 assumes that a variation in open-circuit voltage Vo within the narrower SOC range of 57% to 63% will result directly in the error in integrating the charging/discharging current TB to determine the SOC and corrects the SOC based on the open-circuit voltage Vo, thereby eliminating such an integrating error. The SOC may alternatively be incremented or decremented in a correlation to a difference between the reference voltage V60 and the open-circuit voltage Vo.

The routine proceeds to step 406 wherein it is determined whether the SOC is greater than 65% or not. This reference percentage is determined by adding a margin of 2% to the upper limit of 63% of the Vo based correction range of 57% to 63%. If a NO answer is obtained in step 406, then the routine proceeds to step 408. Alternatively, if a YES answer is obtained, then the routine proceeds to step 407 wherein a maximum SOC is stored in a memory of the battery controller 307. The maximum SOC is the greatest of the SOCs derived so far from the time when the SOC was determined to be greater than 65% in some previous program execution cycle. The maximum SOC is used in performing an additional discharge operation as discussed below and then reset to zero (0).

Figure 1A:
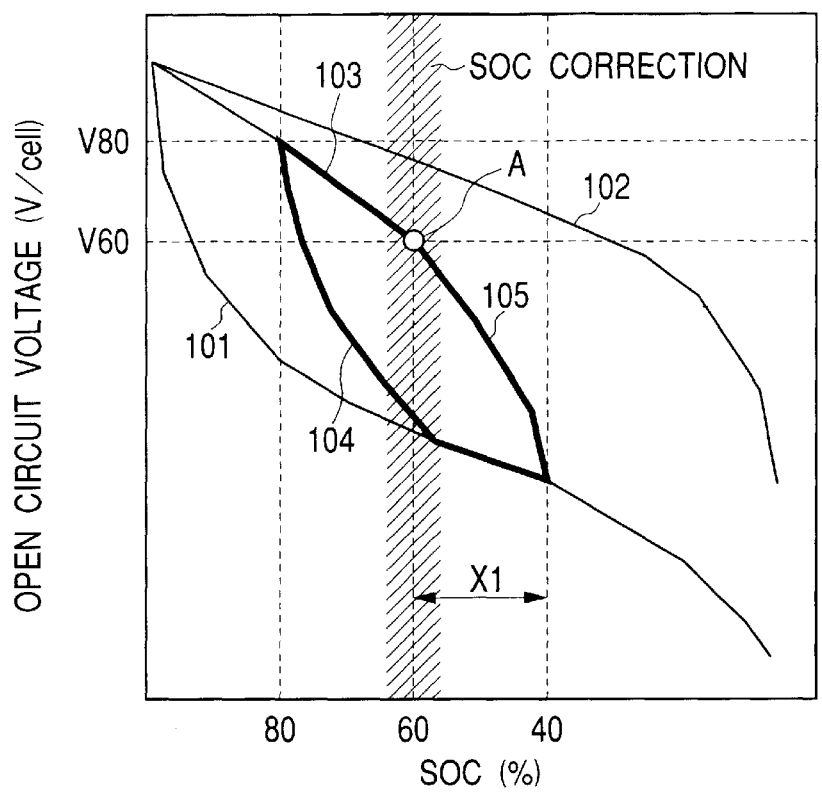
FIG. 1(a) is a graph which shows a hysteresis loop of a state-of-charge of a storage battery when the battery is charged from a target state-of-charge and then discharged.
Figure 1B:
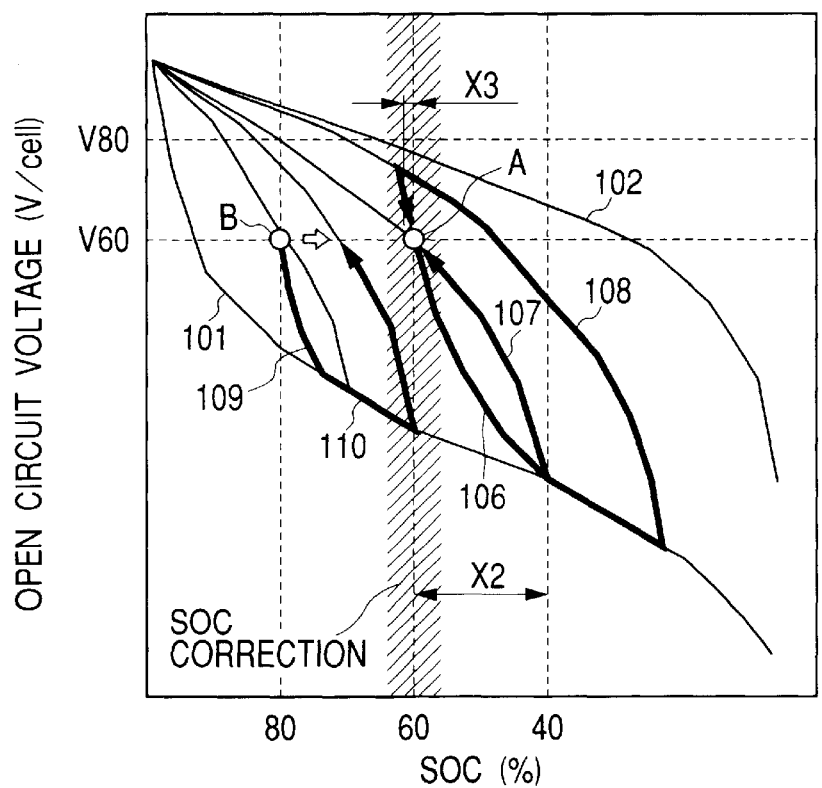
FIG. 1(b) is a graph which shows a hysteresis loop of a state-of-charge of a storage battery when the battery is discharged from a target state-of-charge and then charged.

In step 408, it is determined whether the open-circuit voltage Vo is greater than a given higher SOC open-circuit voltage V80 or not. The higher SOC open-circuit voltage V80 is set to, for example, the value of the open-circuit voltage Vo when the battery unit 405 is, as shown in FIGS. 1(a) and 1(b), charged from a condition where the SOC= 40% and reaches 80% in the SOC. If a NO answer is obtained in step 408, then the routine proceeds to step 410. Alternatively, if a YES answer is obtained, then the routine proceeds to step 409. In step 408, a determination may alternatively be made as to whether the open-circuit voltage Vo lies within a range across the higher SOC open-circuit voltage V80 or not.

In step 409, it is determined whether the SOC lies within a range of 75% to 85% (75%<SOC<85%) or not. If a YES answer is obtained, then the routine proceeds to step 410. Alternatively, if a NO answer is obtained, the SOC is corrected according to Eq. (3), as shown below, to bring the SOC close to 80%.

$$SOC=(SOC+80)/2(\%) \qquad (3)$$

Specifically, when the open-circuit voltage Vo has reached the higher SOC open-circuit voltage V80, it may be considered that the battery unit 405 has been charged for long time from a point A (i.e., the target SOC of 60%) in FIG. 1(a). This indicates the higher possibility that an actual SOC is exactly or near 80%. Therefore, in step 409, the average of the SOC and 80% corresponding to the higher SOC open-circuit voltage Vo is defined as the SOC.

When the open-circuit voltage Vo has exceeded the higher SOC open-circuit voltage V80, the battery controller 307 may prohibit the battery unit 405 from being charged for avoiding the overcharge thereof.

In step 410, it is determined whether the maximum SOC stored in step 407 is greater than 65% or not. If a NO answer is obtained, then the routine proceeds to step 412. Alternatively, if a YES answer is obtained, then the routine proceeds to step 411 wherein a capacity adjustment discharge amount X1 is determined using Eq. (4), as will be described later in detail.

In step 412, it is determined whether the SOC is smaller than 40% or not. If a NO answer is obtained, then the routine proceeds to step 414. Alternatively, if a YES answer is obtained, then the routine proceeds to step 413 wherein a capacity adjustment charge amount X3, as will be described later in detail, is determined.

In step 414, an additional charge/discharge operation, as will be discussed below in detail, are performed in addition to a charge/discharge operation to charge or discharge the battery unit 405 to bring the SOC into agreement with the target of 60%. The routine proceeds to step 415 wherein it is determined whether the traveling of the vehicle has been terminated or not by monitoring the on-off state of the ignition switch. If a NO answer is obtained, then the routine returns back to step 401. Alternatively, if a YES answer is obtained, then the battery controller 307 stores the data derived so far and terminates the operation.

The additional charge/discharge operation carried out in step 414 will be described below in detail.

1. Additional Discharge Operation

In a case where the battery modules 302 are made up of Ni—MH cells, the open-circuit voltage Vo changes along hysteresis loops, as illustrated in FIGS. 1(a) and 1(b), as a function of a change in the SOC of the battery unit 405.

FIG. 1(a) shows an example of hysteresis of the open-circuit voltage Vo. The curve 101 indicates a change in open-circuit voltage Vo when the battery unit 405 is discharged from a full state of charge (SOC=100%) to an empty state of charge (SOC=0%). The curve 102 indicates the open-circuit voltage Vo when the battery unit 405 is charged from the empty state of charge up to the full state of charge.

The battery unit 405 is, as described above, controlled by the battery controller 307 to bring the SOC into agreement with 60%, as indicated by A in the drawing. For example, when the vehicle is running on a long downhill road, the battery unit 405 continues to be charged for a long time. The SOC, thus, increases from the target point A along the curve 103. When the battery controller 307 detects the open-circuit voltage Vo having reached the higher SOC open-circuit voltage V80, it stops a regenerative braking mode of the vehicle. After the vehicle reaches the end of the downhill road and returns to a normal running mode in which the vehicle runs on a horizontal road, the battery controller 307 discharges the battery unit 405, so that the SOC drops along the curves 104 and 101 and falls within the Vo based correction range of 57% to 63%. The battery controller 307 may discharge the battery unit 405 actively immediately after the regenerative braking mode is stopped or permit the battery unit 405 to continue to be charged until the end of the downhill road. When the SOC returns back to the Vo based correction range of 57% to 63%, the battery controller 307 prohibits the state-of-charge correcting operation in step 405, thereby eliminating the effect of the discharge-caused polarization, in which the open-circuit voltage Vo drops due to continuation of discharge, on the state-of-charge correcting operation. The battery controller 307 also prohibits the state-of-charge correcting operation when the open-circuit voltage Vo does not reach the higher SOC open-circuit voltage V80, but the SOC exceeds the Vo based correction range of 57% to 63%, after which it falls within the Vo based correction range of 57% to 63% again. After the SOC falls within the Vo based correction range of 57% to 63%, the battery controller 307 further discharges the battery unit 405 by the capacity adjustment discharge amount X1 of, for example, 20%, as determined in step 411, and returns back to the SOC control operation (i.e., the charge/discharge operation of the battery controller 307) to charge the battery unit 405, so that the SOC increases along the hysteresis curve 105 toward the target point A. When the SOC falls within the Vo based correction range 57% to 63%, the battery controller 307 starts to perform the state-of-charge correcting operation in step 405 sequentially. The maximum SOC stored in step 407 is preferably reset after completion of the above described additional discharge of the battery unit 405.

If the battery unit 405 is charged from the target point A, and it is determined in step 406 that the SOC is greater than 65%, the battery controller 307 determines in step 411 the capacity adjustment discharge amount X1 as a function of the maximum SOC according to Eq. (4) below.

$$X1 = \text{maximum } SOC - 60(\%) \quad (4)$$

This permits the SOC of the battery unit 405 to be controlled to the Vo based correction range of 57% to 63% accurately even if the open-circuit voltage Vo does not reach the higher SOC open-circuit voltage V80. The capacity adjustment discharge amount X1 may be fixed at 20% if the SOC exceeds 80% and reaches, for example, 90% or 100%.

In order to avoid the overcharge-caused deterioration of the battery unit 405, the battery controller 307 may prohibit the battery unit 405 from being charged when detecting the open-circuit voltage Vo reaching the higher SOC open-circuit voltage V80. The reason that the higher SOC open-circuit voltage V80 is used as a reference voltage for prohibiting the battery unit 405 from being charged is that the use of the higher SOC open-circuit voltage V80 enables the avoidance of overcharge of the battery unit 405 even when there is a ±10% variation in capacity between the cells of the battery modules 302 and/or a ±10% error in determining the SOC.

2. Additional Charge Operation

The additional charge operation is to prohibit the state-of-charge correcting operation in step 405 if the SOC of the battery unit 405 decreases along the curves 104 and 101 within the Vo based correction range of 57% to 63% in order to eliminate adverse effects of the charge-caused polarization.

FIG. 1(b) shows an example of hysteresis of the open-circuit voltage Vo when the battery unit 405 is discharged from the target SOC of 60% (i.e., the target point A). For example, when the vehicle is running on a long uphill road, the battery unit 405 continues to be discharged for a long time. The SOC, thus, decreases along the curve 106 from the target point A. If the battery unit 405 continues to be discharged, and the amount of current discharged from the battery unit 405 exceeds a given discharge amount X2, the battery controller 307 starts to charge the batter unit 405 immediately when the vehicle reaches the top of the uphill road or after the vehicle returns to the normal running mode in which the vehicle runs on the horizontal road. The SOC, thus, increases along the hysteresis curve 108. After the SOC falls within the Vo based correction range of 57% to 63%, the battery controller 307 charges the battery unit 405 additionally by the capacity adjustment discharge amount X3 of, for example, 3% and returns back to the normal SOC control operation, thereby allowing the SOC to be controlled so that it decreases along the curve 106 to the target point A. This permits the battery controller 307 to perform the state-of-charge correcting operation in step 405 sequentially and bring the SOC of the battery unit 405 to the target SOC of 60%.

When the SOC is on the curve 108, the battery controller 307 prohibits the state-of-charge correcting operation in step 405 in order to avoid the production of an error in determining the SOC arising from the charge-caused polarization. If there is the possibility of such an error, it is advisable that the battery controller 307 charge the battery unit 405 additionally by the capacity adjustment charge amount X3 and then prohibits the state-of-charge correcting operation for a given period of time (e.g., 10 minutes) to wait for the charge-caused polarization to be reduced to an allowable level. However, the battery controller 307 may alternatively prohibit the battery unit 405 from being discharged at a time when the amount of current discharged from the battery unit 405 reaches the given discharge amount X2. This permits the SOC to increase to the target point A in FIG. 1(b) without need of the additional charge operation, thus eliminating the need for prohibiting the state-of-charge correcting operation. Specifically, the battery controller 307 is designed to perform the additional charge operation only when the amount of current discharged from the battery unit 405 increases over the given discharge amount X2. When the SOC returns to the Vo based correction range 57% to 63% without decreasing below 40%, the battery controller 307 does not prohibit the state-of-charge correcting operation.

For instance, in a case where the SOC of the battery unit 405 determined by the battery controller 307 is 60%, while an actual SOC thereof is 80%, that is, an error has arisen in calculating the SOC, so that the SOC is being controlled, as shown in FIG. 1(b), at a point B, the battery controller 307 corrects the SOC sequentially using the open-circuit voltage Vo in step 405 and discharges the battery unit 405 until the open-circuit voltage Vo is identical with the reference voltage V60, thereby causing the SOC to be changed along the curves 109, 101, and 110. After such discharge is made several times, the actual SOC of the battery unit 405 will be identical with the target SOC of 60%.

Usually, Ni—MH cells exhibit a strong correlation between the SOC and the open-circuit voltage Vo when the SOC is 20% or less. Thus, the battery controller 307 may determine whether the open-circuit voltage Vo has decreased to a reference voltage V20 or not that is an open-circuit voltage when the SOC is 20% and, if so, correct the SOC (SOC=(SOC)+20)/2) to bring it close to 20%. In this case, however, the attention should be paid to the fact that when the vehicle is at rest for a long time after the SOC is decreased to a lower level of 20%, it may become impossible to start the vehicle due to the self-discharge of the battery unit 405.

In a case where the open-circuit voltage Vo does not reach the higher SOC open-circuit voltage V80 for a long time, the battery controller 307 may charge the battery unit 405 actively until the open-circuit voltage Vo reaches the higher SOC open-circuit voltage V80, and then discharge it until the SOC decreases to 40%. This permits the SOC to be controlled to the target SOC of 60% in the charge/discharge operation.

Figure 5:
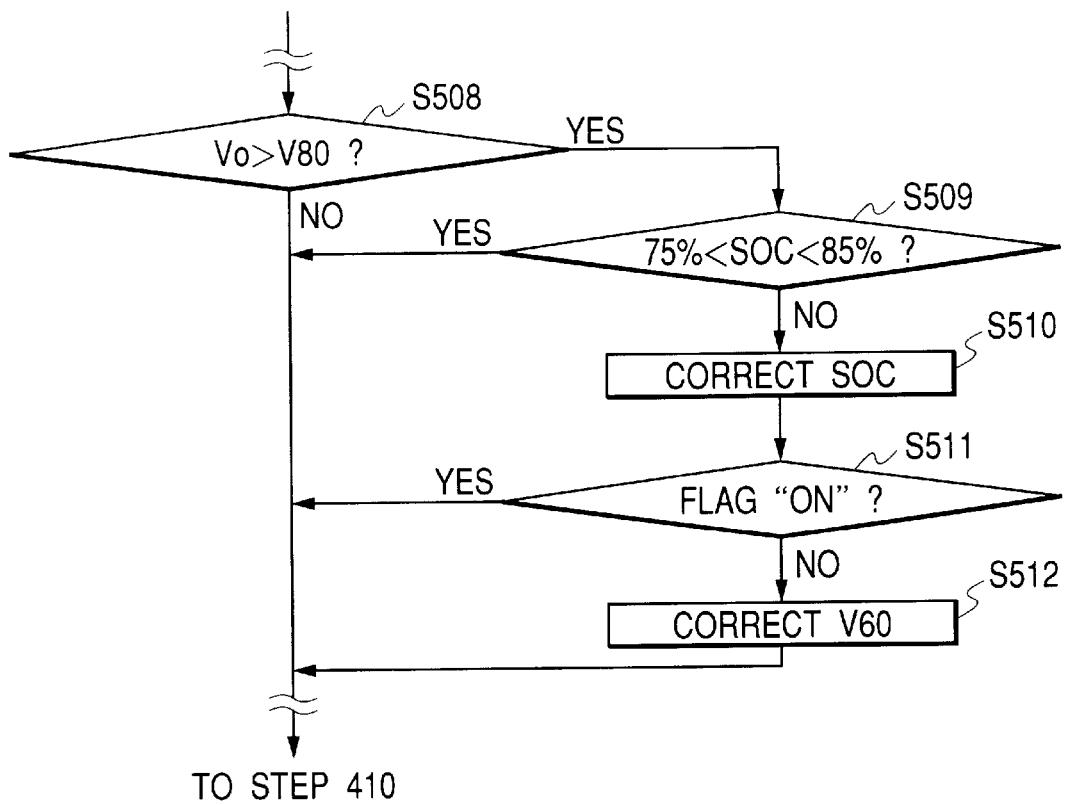
FIG. 5 is a flowchart of a program to control a state-of-charge of a storage battery according to the second embodiment of the invention.

FIG. 5 shows a flowchart of a V60 correcting program executed in the batter controller 307 according to the second embodiment of the invention. Step 508 is identical with step 408 in FIG. 4. Steps 509, 510, 511, and 512 are performed instead of step 409 in FIG. 4. Other steps are identical with those in FIG. 4, and explanation thereof in detail will be omitted here.

In step 508, it is determined whether the open-circuit voltage Vo is greater than the higher SOC open-circuit voltage V80 or not. A determination may alternatively be made as to whether the open-circuit voltage Vo lies within a preselected range across the higher SOC open-circuit voltage V80 or not. If a NO answer is obtained, then the routine proceeds directly to step 410. Alternatively, if a YES answer is obtained, then the routine proceeds to step 509 wherein it is determined whether the SOC lies within a range of 75% to 85% or not. If a YES answer is obtained meaning that the SOC lies within the range of 75% to 85%, then the routine proceeds directly to step 410. Alternatively, if a NO answer is obtained, then the routine proceeds to step 510 wherein the SOC is corrected according to Eq. (3), as discussed above, to be brought close to 80%.

The routine then proceeds to step 511 wherein it is determined whether a V60 learning flag is on or off. If a YES answer is obtained meaning that the reference voltage V60 has been corrected (learned), then the routine proceeds directly to step 410. Alternatively, if a NO answer is obtained, then the routine proceeds to step 512 wherein the reference voltage V60 is corrected according to Eq. (4) below.

$$V60=V60+\alpha \quad (5)$$

where α is a correction value given by Eq. (6) below.

$$\alpha=(SOC'-80)/400 \quad (6)$$

where SOC' is the value of the SOC before corrected by Eq. (3), as discussed above.

Experimental results showed that it is advisable that the corrected reference voltage V60 be within range of an initial value thereof +0.015 to−0.010V/cell for eliminating correction-caused errors.

Figure 6:
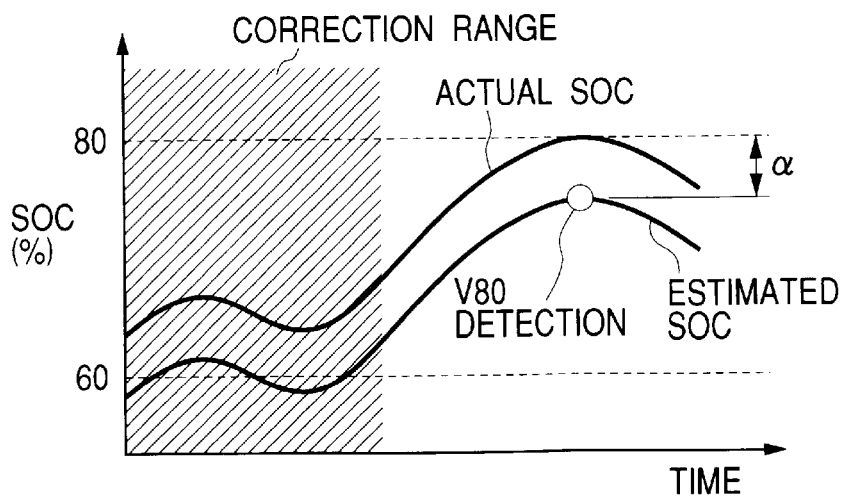
FIG. 6 is a time chart which represents variations in actual state-of-charge and a calculated state-of-charge of a battery.

FIG. 6 shows the correction of the reference voltage V60 in step 512 in an example where the vehicle runs on a long downhill road, so that the battery unit 405 is charged to increase the SOC from the target SOC of 60%.

As can be seen from the drawing, when the calculated SOC that is, in fact, (80−α)% has reached the higher SOC open-circuit voltage V80, the battery controller 307 decides that the calculated SOC is shifted from an actual SOC by α%, that is, that the battery controller 307 has controlled the SOC in error, and thus decreases the reference voltage V60 when (60+α)% is higher than 60% and increases it when (60+α)% is lower than 60%, thereby enabling the battery controller 307 to bring the actual SOC close to or into agreement with the target SOC of 60%.

The above operation enables the actual SOC to be brought into the target SOC of 60% even if there is a variation in battery characteristic between the battery units 405 or variations in surroundings of the vehicles and case of use of the battery units 405.

In a case where the open-circuit voltage Vo does not reach the higher SOC open-circuit voltage V80 for a given long time, the battery controller 307 may charge the battery unit 405 actively until the open-circuit voltage Vo reaches the higher SOC open-circuit voltage V80 for allowing the reference voltage V60 to be corrected in order to increase the accuracy of determining the SOC.

Figure 7:
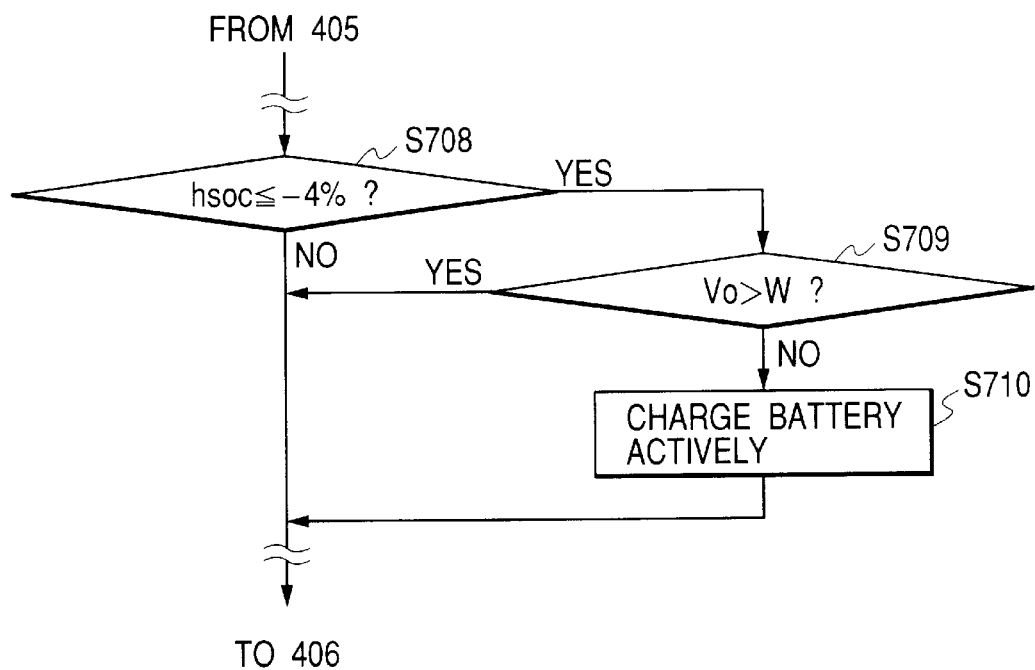
FIG. 7 is a flowchart of a program to control a state-of-charge of a storage battery according to the third embodiment of the invention.

FIG. 7 shows a flowchart of a battery self discharge compensating program according to the third embodiment of the invention. This program is executed by the batter controller 307 between step 405 and step 406 in FIG. 4.

In step 708, it is determined whether a cumulative correction value $h_{SOC}$ (%) is less than or equal to, for example, −4% or not. The cumulative correction value $h_{soc}$ is the sum of the correction values used so far in correcting the SOC in step 405 of FIG. 4 from when the ignition switch was turned on to start the program of FIG. 4, that is, a negative value of a cumulative error in determining the SOC.

If a YES answer is obtained in step 708, then the routine proceeds to step 709 wherein it is determined whether the open-circuit voltage Vo is greater than a reference voltage VV or not. The reference voltage VV is set to a value smaller than the reference voltage V60.

If a YES answer is obtained in step 709, then the routine proceeds to step 710 wherein the battery controller 307 concludes that the battery unit 405 has not been used for a long time, thus resulting in a great increase in self-discharged current and charges the battery unit 405 actively until the open-circuit voltage Vo reaches the higher SOC open-circuit voltage V80. This allows the SOC to be brought into agreement with the target value of 60% along the hysteresis curve.

Figure 8:
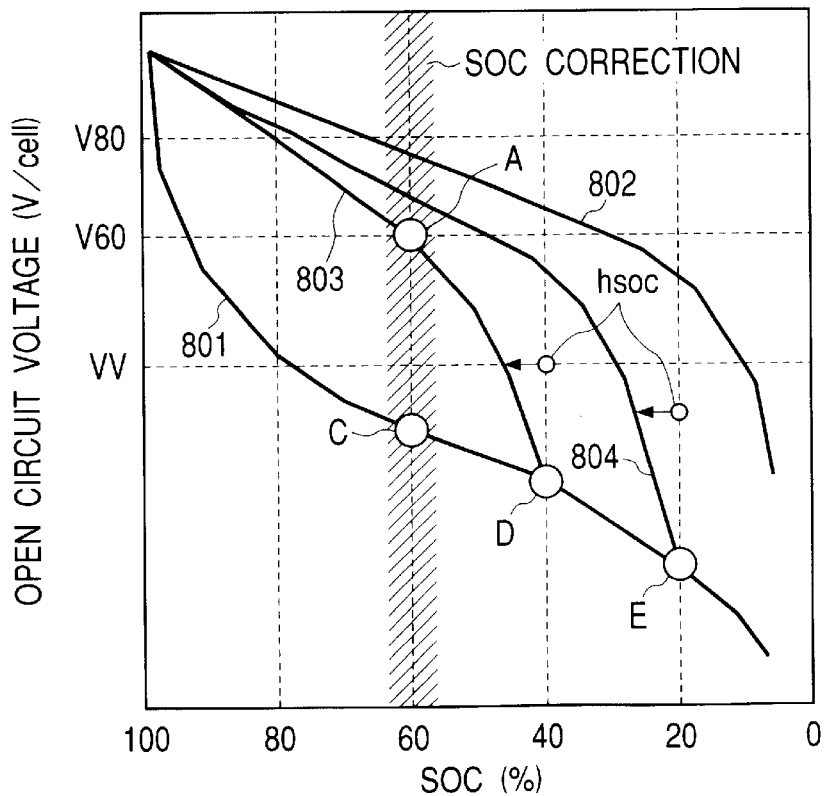
FIG. 8 is a graph which shows control of a state-of-charge of a battery in the operation of FIG. 7.

FIG. 8 shows an example where the open-circuit voltage Vo changes during the operations in steps 708 to 710. The curve 801 is a hysteresis curve of the open-circuit voltage Vo when the battery module 302 is discharged from a full state of charge (SOC=100%) to an empty state of charge (SOC= 0%). The curve 802 is a hysteresis curve of the open-circuit voltage Vo when the battery module 302 is charged from the empty state of charge to the full state of charge.

If the vehicle is at rest for a long time after the SOC is controlled around the target point A (i.e., SOC=60%), it will cause an actual SOC of the battery unit 405 to decrease to point C, to point D, and to point E on the hysteresis curve 801. In a case of a Ni—MH battery, an actual SOC decreases from the target point A to the point C in 4 or 5 days and from the point C to the point D or from the point D to the point E in one month at room temperature. Specifically, the self discharge rate is greater than that of a lead storage battery.

For example, if the vehicle is at rest for a long time, so that the battery unit 405 is self-discharged, and an actual SOC of the battery unit 405 is on the point D (SOC=40%), while the SOC calculated in the battery controller 307 is 60%, the battery controller 307 starts to perform, as described above, the state-of-charge correcting operation in step 405 sequentially and charges the battery unit 405 to increase an actual SOC up to 60% along the curve 803. When the cumulative correction value $h_{SOC}$ reaches −4%, the open-circuit voltage Vo, as can be seen in the drawing, exceeds the reference voltage VV. In this case, a YES answer is obtained in step 709, so that the battery controller 307 determines that it is possible to increase the SOC along the curve 803 and charges the battery unit 405 until the SOC reaches the target SOC of 60%.

Alternatively, if an actual SOC is decreased by the self discharge down to the point E (actual SOC=20%, calculated SOC=60%), the battery controller 307 performs the state-of-charge correcting operation in step 405 and charges the battery unit 405 to increase the actual SOC along the curve 804. However, even when the open-circuit voltage Vo reaches the reference voltage V60, the actual SOC does not reach 60%. In this case, at a time when the battery unit 405 is charged by 4%, the open-circuit voltage Vo, as shown in the drawing, does not yet reach the reference voltage VV. The battery controller 307 may, thus, determine that the actual SOC of the battery unit 405 has decreased below 40% due to the self discharge. Specifically, when the cumulative correction value $h_{SOC}$ has reached −4% (YES in step 708) meaning that the battery unit 405 has been charged by 4%, but the open-circuit voltage Vo does not yet reach the reference voltage VV (NO answer in step 710), the battery controller 307 concludes in step 710 that the actual SOC of the battery unit 405 has decreased below 40% due to the self discharge, and charges the battery unit 405 actively until the open-circuit voltage Vo reaches the higher SOC open-circuit voltage V80. This allows the SOC to be brought into agreement with the target point A along the hysteresis curve 803.

The reason that the battery controller 307 does not determine whether the actual SOC has been decreased below 40% by the self discharge or not directly using the open-circuit voltage Vo is because the memory effect has occurred in the battery unit 405 made of Ni—MH batteries, it will cause the hysteresis curve 801 of FIG. 8 to be shifted in a direction in which the open-circuit voltage Vo drops (i.e., the downward direction). In this case, it becomes impossible for the battery controller 307 to decide whether the voltage drop is caused by the self discharge or the memory effect of the battery unit 405. In order to avoid this problem, the battery controller 307 of this embodiment is designed to determine whether the open-circuit voltage Vo has reached the reference voltage VV at the time when the battery unit 405 is charged by 4%, that is, when a charge-caused polarization condition where the memory effect would not occur has been encountered for determining whether the actual SOC has been decreased below 40% by the self discharge or not.

The embodiments have been described with reference to the Ni—HM cell, but however, the battery modules 302 may alternatively be made up of another type of secondary cells. Instead of the open-circuit voltage Vo, the voltage appearing at the terminals of the battery unit 405 when a given amount of current is flowing from or into the battery unit 405 or when the battery unit 405 is charged or discharged with a given electric power may be used.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments witch can be embodied without departing from the principle of the invention as set forth in the appended claims.

What is claimed is:

1. A battery control method of charging or discharging a storage battery installed in a hybrid vehicle to bring a calculated state-of-charge of the storage battery into agreement with a target state-of-charge, comprising the steps of:

determining an open-circuit voltage of the storage battery installed in the hybrid vehicle using a voltage developed across the storage battery and a current flowing into or out of the storage battery in a given voltage-to-current relation of the storage battery;

totalizing an amount of current flowing into or out of the storage battery in a cycle to calculate a state-of-charge of the storage battery;

comparing the open-circuit voltage with a reference voltage which corresponds to a reference state-of-charge predetermined in a state-of-charge correction range defined around a target state-of-charge of the storage battery; and correcting the state-of-charge of the storage battery when the state-of-charge lies within the state-of-charge correction range by brining the state-of-charge close to the reference state-of-charge based on a result of comparison between the open-circuit voltage and the reference voltage.

2. A battery control method as set forth in claim 1, further comprising the step of prohibiting said correction step when it is determined that a discharge-caused polarization of the storage battery becomes greater than a given value.

3. A battery control method as set forth in claim 1, wherein said correcting step increases the state-of-charge when the open-circuit voltage is greater than the reference voltage and decreases the state-of-charge when the open-circuit voltage is smaller than the reference voltage.

4. A battery control method as set forth in claim 1, further comprising the step of prohibiting said correction step for a preselected period of time when the storage battery has been discharged so that the state-of-charge decreases by a given amount out of the state-of-charge correction range.

5. A battery control method as set forth in claim 1, further comprising the step of determining whether the open-circuit voltage has exceeded a high open-circuit voltage higher than said reference voltage or not and the step of correcting said reference voltage by a preselected value when it is determined that the open-circuit voltage has exceeded the high open-circuit voltage.

6. A battery control method as set forth in claim 1, wherein instead of the open-circuit voltage, a voltage developed across terminals of the storage battery when the storage battery is charged or discharged with a given current is used.

7. A battery control method as set forth in claim 1, wherein said correction step changes the state-of-charge of the storage battery by a preselected correction value in a cycle when the state-of-charge lies within the state-of-charge correction range, and further comprising the step of determining that the storage battery has undergone a drop in state-of-charge due to self discharge when a cumulative value of the correction value exceeds a given value, and the open-circuit voltage remains below a given voltage lower than said reference voltage.

8. A battery control method of charging or discharging a storage battery installed in a hybrid vehicle to bring a calculated state-of-charge of the storage battery into agreement with a target state-of-charge, comprising the steps of:

determining an open-circuit voltage of the storage battery installed in the hybrid vehicle using a voltage developed across the storage battery and a current flowing into or out of the storage battery in a given voltage-to-current relation of the storage battery;

totalizing an amount of current flowing into or out of the storage battery in a cycle to calculate a state-of-charge of the storage battery;

determining whether the storage battery has been charged so that the state-of-charge of the storage battery increases out of a preselected state-of-charge range defined around the target state-of-charge or not;

determining whether the open-circuit voltage has reached a high open-circuit voltage higher than a reference voltage which corresponds to a reference state-of-charge predetermined in the state-of-charge range or not; and discharging the storage battery until the state-of-charge reaches a given value smaller than the preselected state-of-charge range by a given amount when it is determined that the open-circuit voltage has reached the high open-circuit voltage.

9. A battery control method as set forth in claim 8, further comprising the step of prohibiting the storage battery from being charged when it is determined that the open-circuit voltage has reached the high open-circuit voltage.

10. A battery control method as set forth in claim 8, further comprising the step of, when the storage battery has been charged so that the state-of-charge is greater than a high state-of-charge higher than the preselected state-of-charge range, determining a maximum value of the state-of-charge calculated in a cycle and the step of discharging the storage battery by a given amount determined as a function of the maximum value of the state-of-charge after the storage battery is discharged, and the state-of-charge falls within the preselected state-of-charge range.

11. A battery control methods as set forth in claim 10, wherein the maximum value is reset each time the storage battery is discharged by said given amount.

12. A battery control method as set forth in claim 8, further comprising the step of charging the storage battery until the open-circuit voltage reaches the high open-circuit voltage when the open-circuit voltage remains below the high open-circuit voltage for a given period of time.

13. A battery control method as set forth in claim 8, wherein instead of the open-circuit voltage, a voltage developed across terminals of the storage battery when the storage battery is charged or discharged with a given current is used.

14. A battery control method of charging or discharging a storage battery installed in a hybrid vehicle to bring a calculated state-of-charge of the storage battery into agreement with a target state-of-charge, comprising the steps of:

totalizing an amount of current flowing into or out of the storage battery in a cycle to calculate a state-of-charge of the storage battery;

determining whether the storage battery has been discharged until the state-of-charge of the storage battery decreases by a given amount out of a preselected state-of-charge range defined around the target state-of-charge or not; and charging the storage battery until the state-of-charge reaches a given value higher than the preselected state-of-charge range by a predetermined amount when it is determined that the storage battery has been discharged until the state-of-charge of the storage battery decreases by the given amount.

15. A battery control method as set forth in claim 14, further comprising the step of prohibiting the storage battery from being discharged further when it is determined that the storage battery has been discharged until the state-of-charge of the storage battery decreases by the given amount.

16. A battery control method as set forth in claim 15, further comprising the steps of: determining an open-circuit voltage of the storage battery using a voltage developed across the storage battery and a current flowing into or out of the storage battery in a given voltage-to-current relation of the storage battery; comparing the open-circuit voltage with a reference voltage which corresponds to a reference state-of-charge predetermined in the preselected state-of-charge range; correcting the state-of-charge of the storage battery only when the state-of-charge lies within the preselected state-of-charge range by brining the state-of-charge close to the reference state-of-charge based on a result of comparison between the open-circuit voltage and the reference voltage; and prohibiting said correction step for a preselected period of time when the storage battery has been discharged so that the state-of-charge decreases by a given amount out of the preselected state-of-charge range.

17. A battery control method as set forth in claim 14, wherein instead of the open-circuit voltage, a voltage developed across terminals of the storage battery when the storage battery is charged or discharged with a given current is used.

18. A battery control method of charging or discharging a storage battery installed in a hybrid vehicle to bring a calculated state-of-charge of the storage battery into agreement with a target state-of-charge, comprising the steps of:

determining an open-circuit voltage of the storage battery installed in the hybrid vehicle using a voltage developed across the storage battery and a current flowing into or out of the storage battery in a given voltage-to-current relation of the storage battery;

totalizing an amount of current flowing into or out of the storage battery in a cycle to calculate a state-of-charge of the storage battery;

determining whether the storage battery has been charged so that the state-of-charge of the storage battery increases out of a preselected state-of-charge range defined around the target state-of-charge or not;

determining whether the open-circuit voltage has exceeded a high open-circuit voltage higher than a reference voltage which corresponds to a reference state-of-charge predetermined in the preselected state-of-charge range or not; and correcting said reference voltage by a preselected value when it is determined that the open-circuit voltage has exceeded the high open-circuit voltage.

19. A battery control method as set forth in claim 18, further comprising the step of determining whether the state-of-charge has exceeded a high state-of-charge higher than the preselected state-of-charge range or not, and wherein said correction step corrects said reference voltage when it is determined that the state-of-charge has exceeded the high state-of-charge.

20. A battery control method as set forth in claim 18, further comprising the step of charging the storage battery until the open-circuit voltage reaches the high open-circuit voltage when the open-circuit voltage remains below the high open-circuit voltage for a given period of time.

21. A battery control method as set forth in claim 18, wherein instead of the open-circuit voltage, a voltage developed across terminals of the storage battery when the storage battery is charged or discharged with a given current is used.

* * * * *